United States Patent
Lin et al.

(10) Patent No.: US 12,518,992 B2
(45) Date of Patent: *Jan. 6, 2026

(54) RETICLE RETAINING SYSTEM

(71) Applicant: GUDENG PRECISION INDUSTRIAL CO., LTD, New Taipei (TW)

(72) Inventors: Shu-Hung Lin, New Taipei (TW); Chia-Ho Chuang, New Taipei (TW); Ming-Chien Chiu, New Taipei (TW); Hsin-Min Hsueh, New Taipei (TW)

(73) Assignee: GUDENG PRECISION INDUSTRIAL CO., LTD, New Taipei (TW)

( * ) Notice: Subject to any disclaimer, the term of this patent is extended or adjusted under 35 U.S.C. 154(b) by 200 days.

This patent is subject to a terminal disclaimer.

(21) Appl. No.: 17/868,880

(22) Filed: Jul. 20, 2022

(65) Prior Publication Data

US 2022/0351998 A1 Nov. 3, 2022

Related U.S. Application Data

(63) Continuation of application No. 16/758,865, filed as application No. PCT/CN2019/113628 on Oct. 28, 2019, now Pat. No. 11,508,592.

(Continued)

(51) Int. Cl.
*H01L 21/673* (2006.01)
*G03F 1/66* (2012.01)
*H01L 21/67* (2006.01)

(52) U.S. Cl.
CPC .......... *H01L 21/67359* (2013.01); *G03F 1/66* (2013.01); *H01L 21/67294* (2013.01); *H01L 21/67376* (2013.01)

(58) Field of Classification Search
CPC ........ H01L 21/67359; H01L 21/67376; H01L 21/672941; G03F 1/66
See application file for complete search history.

(56) References Cited

U.S. PATENT DOCUMENTS 10,103,045 B2 * 10/2018 Liu .................... H01L 21/67359
11,508,592 B2 * 11/2022 Lin .................... H01L 21/67376
(Continued)

FOREIGN PATENT DOCUMENTS

JP S63178974 A 7/1988
JP H03269535 A 12/1991
(Continued)

*Primary Examiner* — Orlando E Aviles
*Assistant Examiner* — Jenine Pagan
(74) *Attorney, Agent, or Firm* — Troutman Pepper Locke LLP; Tim Tingkang Xia, Esq.

(57) ABSTRACT

The instant disclosure discloses a reticle retaining system comprising an inner pod and an outer pod. The inner pod is configured to receive a reticle that includes a first identification feature. The inner pod comprises an inner base having a reticle accommodating region generally at a geometric center thereof and surrounded by a periphery region, and an inner cover configured to establish sealing engagement with the inner base. The inner base has a first observable zone defined in the reticle accommodating region correspondingly arranged to allow observation of the first identification feature. The outer pod is configured to receive the inner base. The outer pod comprises an outer base having a second observable zone defined thereon observably aligned to the first observable zone of the inner pod upon receiving the inner pod, and an outer cover configured to engage the outer base and cover the inner pod.

17 Claims, 6 Drawing Sheets

Related U.S. Application Data

(60) Provisional application No. 62/751,736, filed on Oct. 29, 2018.

(56) References Cited

U.S. PATENT DOCUMENTS

| | | | |
|---|---|---|---|
| 2002/0102015 A1 | 8/2002 | Hunatsu | |
| 2006/0260978 A1 | 11/2006 | Gregerson et al. | |
| 2007/0146681 A1 | 6/2007 | Yamamoto | |
| 2007/0206173 A1* | 9/2007 | Suzuki | G03F 7/70741 |
| | | | 355/75 |
| 2008/0024751 A1 | 1/2008 | Hirayanagi | |
| 2008/0173560 A1* | 7/2008 | Umeda | H01L 21/67353 |
| | | | 209/558 |

FOREIGN PATENT DOCUMENTS

| | | | |
|---|---|---|---|
| JP | 08017906 A | 1/1996 | |
| JP | H10116785 A | 5/1998 | |
| JP | 2000340642 A | 12/2000 | |
| JP | 2005091983 A | 4/2005 | |
| JP | 2007086363 A | 4/2007 | |
| JP | 2007329439 A | 12/2007 | |
| JP | 2013054218 A | 3/2013 | |
| JP | 2013167795 A | 8/2013 | |
| KR | 20150144974 A | 12/2015 | |
| WO | 2016121635 A1 | 8/2016 | |
| WO | 2017102380 A1 | 6/2017 | |

* cited by examiner

RETICLE RETAINING SYSTEM

CROSS-REFERENCE TO RELATED APPLICATIONS

This application is a continuation application of U.S. patent application Ser. No. 16/758,865, filed Apr. 24, 2020, which is a national stage entry of PCT Patent Application Serial No. PCT/CN2019/113628, filed Oct. 28, 2019, which itself claims priority to and the benefit of U.S. Provisional Patent Application Ser. No. 62/751,736, filed Oct. 29, 2018.

FIELD

This present disclosure relates to container for storage, transport, shipping and processing of fragile objects such as photomasks, reticles, and wafers, and, in particular, to retaining system for storage, transport, shipping, and processing of a reticle.

BACKGROUND

In semiconductor industry, photomask retainer (or reticle retainer) evolves with the heightened precision requirements of the payload thereof to meet the demand for increased level of protection from potential ambient hazards.

For example, newer generation reticle retainers are sometimes provided with a dual-pod configuration that include an inner pod for receiving a reticle and an outer pod for accommodating the inner pod. During delivery, a reticle may be packed inside the inner pod. For executing a lithography process, the outer pod may be opened to allow retrieval of the inner pod therefrom. The inner pod may then be opened for subsequent exposure process using the contained reticle upon arriving to a designated position inside an exposure apparatus.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
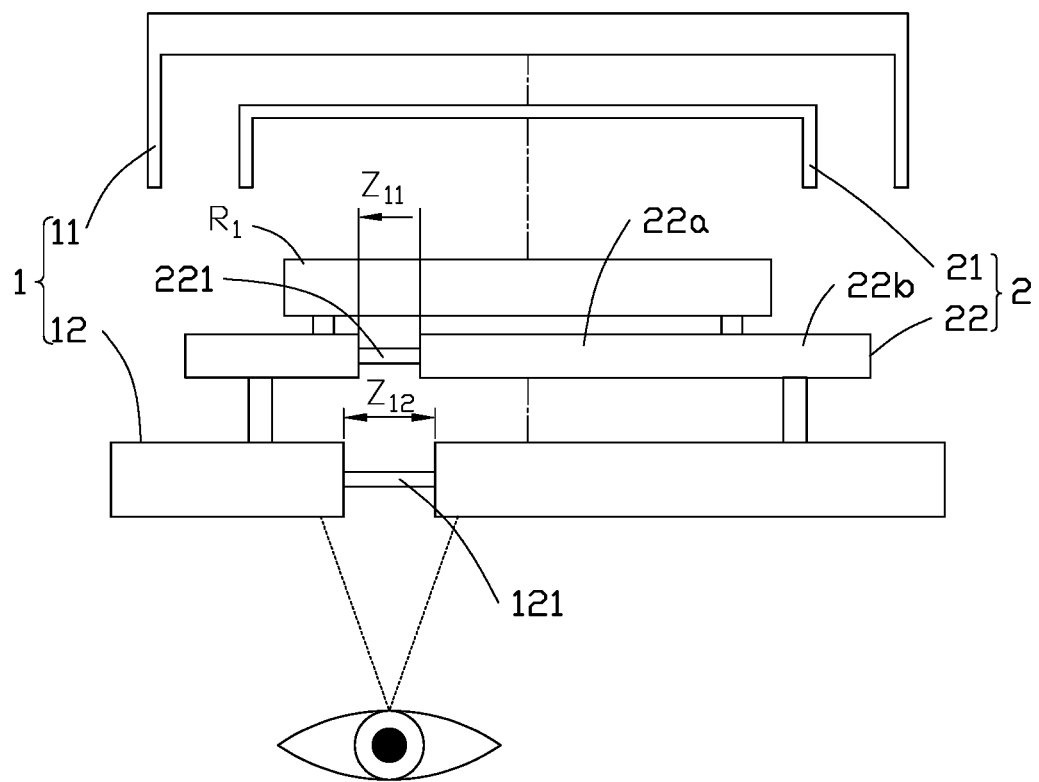
FIG. 1 illustrates a schematic cross-sectional view of a reticle retaining system in accordance with some embodiments of the instant disclosure.

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary embodiments in conjunction with the accompanying drawings in FIGS. 1 to 6. Reference will be made to the drawing figures to describe the present disclosure in detail, wherein depicted elements are not necessarily shown to scale and wherein like or similar elements are designated by same or similar reference numeral through the several views and same or similar terminology.

FIG. 1 illustrates a schematic cross-sectional view of a reticle retaining system in accordance with some embodiments of the instant disclosure. For illustrational simplicity and clarity, some detail/sub components of the exemplary device are not explicitly labeled/shown in the instant figure.

Referring to FIG. 1, the exemplary reticle retaining system 100 comprises an outer pod 1 and an inner pod 2 configured to be received by the outer pot 1. The inner pod 2 is configured to receive a reticle. In the illustrated embodiment, the inner pod 2 includes an inner base 22 that defines a reticle accommodating region 22a. The reticle accommodating region 22a is surrounded by a periphery region 22b. The inner pod 2 further includes an inner cover 21 configured to establish engagement with the periphery region 22b of the inner base 22, so as to cooperatively form an interior volume upon enclosure for accommodating a reticle $R_1$. In order to provide thorough protection to its sensitive and fragile content, in some embodiments, the inner cover 21 and the inner base 22 are provided with electromagnetic interference (EMI) shielding property. Suitable material for providing EMI shielding capability may include conductive such as metal. In some embodiments, metallic coating (such as copper or gold) may be provided over the surface of the inner pot 2. In some embodiments, both the inner cover 21 and inner base 22 are made of metal material, such as aluminum.

As shown in FIG. 1, the exemplary outer pod 1 is configured to house the inner pod 2. In the illustrated embodiment, the outer pod 1 comprises an outer base 12 configured to receive the inner base 22 and an outer cover 11 configured to engage the outer base 12 (and cover the inner pod 2). The outer base 12 may be provided with static charge dissipation property. In some embodiments, the outer pod 1 may be constructed from polymer material mixed with conductive fibers. For instance, in some embodiments, either one or both of the outer cover 11 and outer base 12 is made from resin material embedded with carbon fibers.

In some embodiments, the inner cover 21 is configured to establish sealing engagement with the periphery region 22b of the inner base 22. In some embodiments, the inner cover 21 may be configured to establish pressing engagement with the inner base 22 through pressure from the outer cover 11 upon enclosure between the outer base 12 and the outer cover 11. In some embodiments, a pressing engagement between the inner cover 21 and the inner base 22 may be formed through a substantially planar metal to metal interface. In general, the pressing engagement establishes a sealing enclosure that prevents dust and humidity from entering into the interior volume through the contact interface between the upper and lower members of the inner pod 2. In some embodiments, either or both of the inner cover 21 and the inner base 22 may be provided with additional sealing element (e.g., sealing gasket or O-ring) at the respective engaging interface region to further enhance interdicting capability against ambient contamination.

As shown in FIG. 1, the exemplary system has a first observable zone $Z_{11}$ defined in the reticle accommodating region 22a of the inner base 22 to allow observation of the reticle $R_1$. In the illustrated embodiment, the inner base 22 includes an inner optical member 221 provided in the first observable zone $Z_{11}$. In some embodiments, the inner optical member 221 may be made of a signal transmissive material with respect to infrared light, visible light, or ultraviolet. Suitable material of the inner optical member 221 may include glass (e.g., quartz glass), acrylic, transparent plastic, or comparable materials. In the illustrated embodiment, the inner optical member 221 may include a piece of quartz glass embeddedly arranged in the inner base 22 (in the reticle accommodating region 22a).

In the instant embodiment, the first observable zone $Z_{11}$ is correspondingly designed to allow observation of a first identification feature (e.g., a 1-D or 2-D bar code) of the reticle $R_1$ upon receipt of the reticle $R_1$ (not explicitly shown in the schematic illustration). In some embodiments, the first identification feature of the reticle $R_1$ is formed on a window-facing surface in the first observable zone $Z_{11}$.

The outer base 12 has a second observable zone $Z_{12}$ defined thereon. The second observable zone $Z_{12}$ is arranged to be observably aligned to the first observable zone $Z_{11}$ of the inner pod 1. As such, optical confirmation (such as the condition of the reticle $R_1$ and the first identification) of the reticle $R_1$ retained in the reticle retaining system 100 may be achieved by optical scanning through the second observable zone $Z_{12}$ and first observable zone $Z_{11}$. Accordingly, the frequency of pod opening may be reduced during semiconductor fabrication process, which in turn minimizes exposure of the sensitive precision workpiece to the potentially hazardous ambient factors.

In the illustrated embodiment, the outer base 12 has an outer optical member 121 embeddedly arranged in the second observable zone $Z_{12}$. In some embodiments, the outer optical member 121 may be made of a signal transmissive material with respect to infrared light, visible light, or ultraviolet. Suitable material of the outer optical member 121 may include glass (e.g., quartz glass), acrylic, transparent plastic, or comparable materials. In some embodiments, a transmittance value of the outer optical member 121 is greater than 80% with respect to optical signals in one or more of the abovementioned spectrum ranges. Depending on specific applicational requirement, in some embodiments, the optical members (e.g., outer optical members and/or inner optical member) may include concave/convex surface.

In some embodiments, the inner optical member 221 has a lower reflectance value than the outer optical member 121 with respect to wavelength in a range between 600 nm to 950 nm. In some embodiments, the corresponding wavelength range for the optical members may be in a range of about 630 nm to 930 nm. In some embodiments, a reflectance value of the outer optical member 121 with respect to the abovementioned wavelength range may be less than 15%. In some embodiments, a reflectance value of the inner optical member 221 with respect to the abovementioned range of wavelength may be less than 0.5%. In some embodiments, the inner optical member 221 may be further provided with an anti-reflection coating. In some embodiments, the inner optical member 221 may be further provided with a layer having EMI shielding property.

In some embodiments, the inner optical member 221 may be sealingly installed in the first observable zone $Z_{11}$. For example, the construction of the inner optical member 221 may include a sealing member around the optically transmissive member (e.g., O-ring). In general, the construction of the inner optical member 221 provides a sealing enclosure capable of sufficiently preventing dust and humidity from entering into the interior volume through the structural interface between the optical member and the inner base. In some embodiments, the optical member 221 may be constructed to achieve airtight level sealing.

In some embodiments where dust-resisting and/or dust-proofing requirement is stringent, the outer optical member 121 in the second observable zone $Z_{12}$ of the outer base 12 may be provided with similar sealing mechanism. However, in applications where inner sealing alone is sufficient, the outer optical member 121 may be constructed without utilizing sealing mechanism for reduction of structural complexity, weight, and cost concerns.

Figure 2:
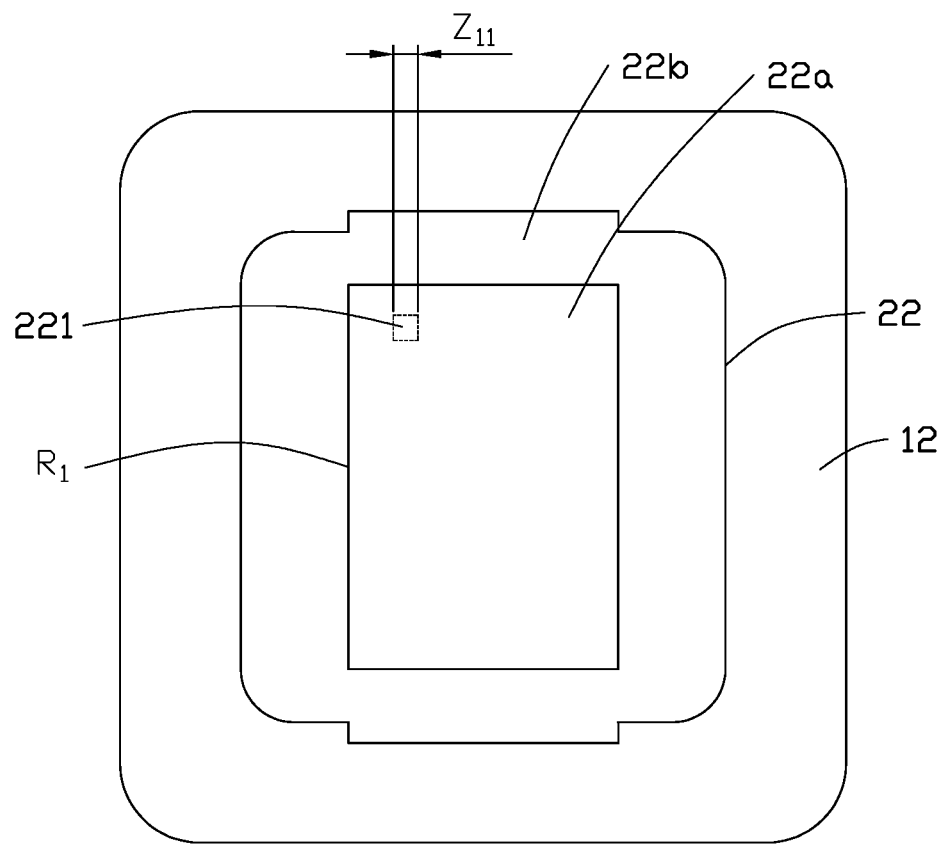
FIG. 2 illustrates a schematic plane view of a reticle retaining system in accordance with some embodiment of the instant disclosure.

FIG. 2 illustrates a plane view of a reticle retaining system in accordance with some embodiments of the instant disclosure. For illustrational simplicity and clarity, some detail/sub components of the exemplary device are not explicitly labeled/shown in the instant figure. For example, an inner cover and an outer cover are not shown.

In the illustrated embodiment, the reticle $R_1$, the inner base 22 and the outer base 12 has a substantially planar rectangular profile in the plane view. As shown in the instant figure, the reticle accommodating region 22a of the exemplary inner base 22 is formed generally at a geometric center thereof.

Figure 3:
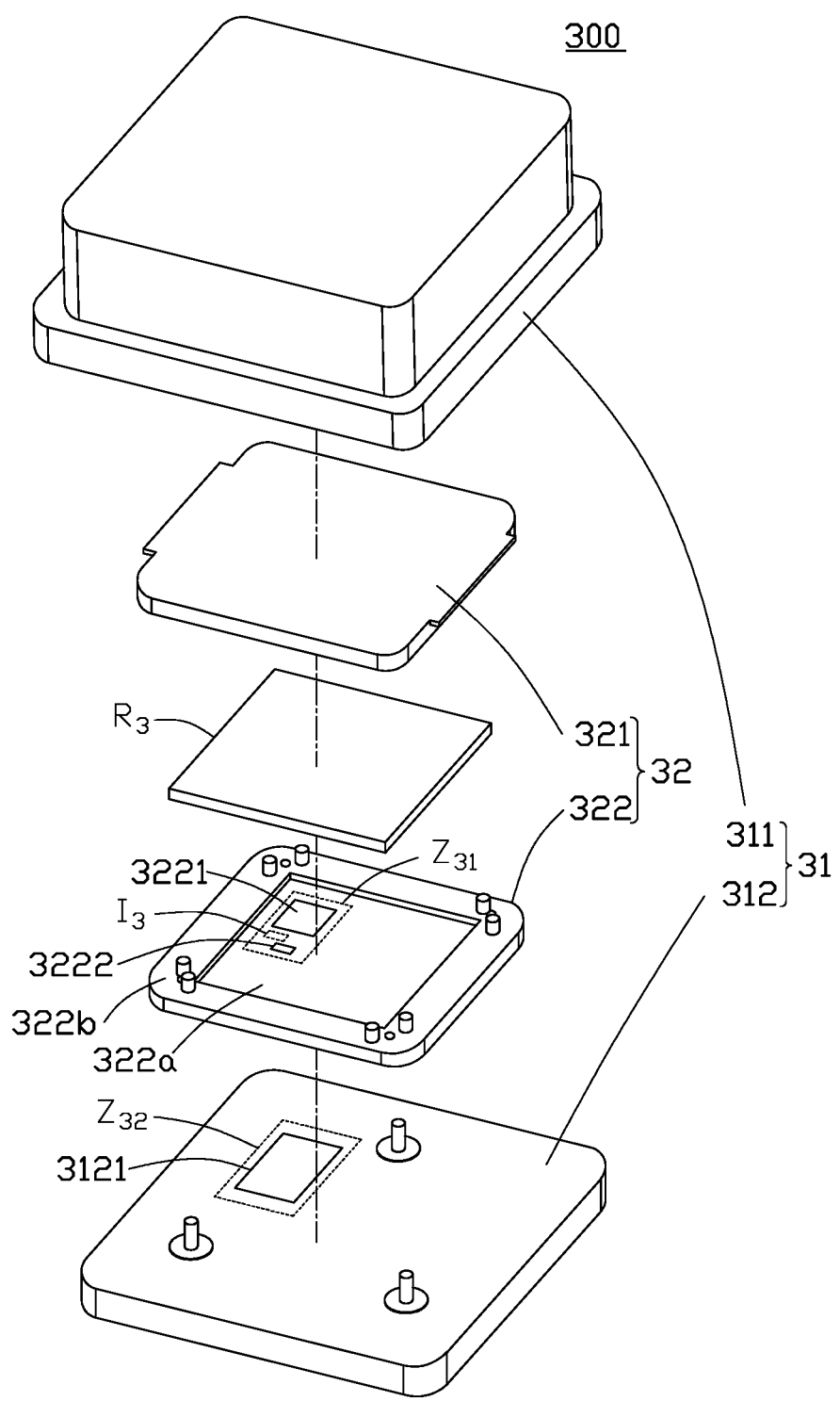
FIG. 3 illustrates an isometric exploded view of a reticle retaining system in accordance with some embodiment of the instant disclosure.

FIG. 3 illustrates an isometric exploded view of a reticle retaining system in accordance with some embodiment of the instant disclosure. For illustrational simplicity and clarity, some detail/sub components of the exemplary device are not explicitly labeled in the instant figure.

The exemplary reticle retainer 300 comprises an outer pod 31 and an inner pod 32 configured to be disposed therein. The inner pod 32 is configured to receive a reticle. The inner pod 32 includes an inner base 322 and an inner cover 321. The inner base 322 defines a reticle accommodating region 322a that is surrounded by a periphery region 322b. The inner cover 321 is configured to establish engagement with the periphery region 322b of the inner base 322, so as to cooperatively define an interior volume upon enclosure for accommodating a reticle $R_3$.

The outer pod 31 is configured to house the inner pod 32. In the illustrated embodiment, the outer pod 31 comprises an outer base 312 configured to receive the inner base 322, and an outer cover 311 configured to engage the outer base 312 and cover the inner pod 32.

In some embodiments, the inner cover 321 may be configured to establish sealing engagement with the periphery region 322b of the inner base 322. For example, the inner cover 321 may be configured to be pressed by the outer cover 311 upon the engaging between outer base 312 and outer cover 311.

In some embodiments, the inner cover 321 and the inner base 322 may be provided with electromagnetic interference (EMI) shielding property, thereby reducing adverse impact on the reticle $R_3$. In some embodiments, suitable material and construction of the inner cover 321 and the inner base 322 may be comparable to that described in the previous embodiments. In the illustrated embodiment, both of the inner cover 321 and the inner base 322 are made of aluminum using, e.g., computer numerical control (CNC) machining technique.

As shown in the instant figure, a first observable zone $Z_{31}$ is defined in the reticle accommodating region 322a of the inner base 322 to allow observation of the reticle $R_3$. In the illustrated embodiment, the inner base 322 includes two inner optical members 3221, 3222 embedded in the first observable zone $Z_{31}$.

In the illustrated embodiment, the inner base 322 comprises a third identification feature $I_3$ at a bottom side thereof. In some embodiments, the third identification feature $I_3$ may include a two-dimensional bar code such as a quick response code (QR code). In some embodiments, the third identification feature $I_3$ may be a visual graphical feature for indicating the orientation of inner pod 32 relative to the outer pod 31. For instance, the third identification feature $I_3$ may include an asymmetric pattern.

The outer base 312 has a second observable zone $Z_{32}$ defined thereon observably aligned to the first observable zone $Z_{31}$ of the inner pod 31 upon receiving the inner pod 31. As such, confirmation on information (such as the condition or status of the reticle $R_3$ and the first identification $I_1$ thereof) of the reticle $R_3$ retained in the reticle retaining system 300 may be achieved simply via scanning through the second observable zone $Z_{32}$ and first observable zone $Z_{31}$, thereby reducing the number of times the outer pod 32 has to be opened. A scanner S (shown in FIG. 4) may be provided to scan the third identification feature $I_3$ of the inner pod 32 through the out optical member 3121 so as to identify the orientation of the inner pod 32. Subsequent adjustment may be made to fine-tune the orientation.

In the illustrated embodiment, the outer base 312 has an outer optical member 3121 embedded in the second observable zone $Z_{32}$. In some embodiments, the outer optical member 3121 may be made of an optically transmissive material with respect to infrared light, visible light, or ultraviolet. In some embodiments, a transmittance value of the outer optical member 3121 is greater than 80%. Suitable material of the outer optical member 121 may be comparable to that of the outer optical member described in previous embodiments.

In some embodiments, the inner optical member 3221 has a lower reflectance value than the outer optical member 3121 with respect to wavelength in a range between 600 nm to 950 nm. In some embodiments, the corresponding wavelength range for the optical members may be in a range of about 630 nm to 930 nm. In some embodiments, a reflectance value of the outer optical member 3121 with respect to the corresponding wavelength range may be less than about 15%. In some embodiments, a reflectance value of the inner optical member 3221 with respect to the corresponding wavelength range may be less than about 0.5%. In some embodiments, the inner optical member 3221 may be further provided with an anti-reflection coating. The anti-reflection coating may be attributed to a low reflectance value of the inner optical member 3221.

In some embodiments, the two inner optical members 3221, 3222 may be sealingly installed in the first observable zone $Z_{31}$. In some embodiments, the two inner optical members 3221, 3222 may be made of an optically transmissive material with respect to infrared light, visible light, or ultraviolet. In some embodiments, suitable material of two inner optical members 3221, 3222 may be comparable to that described in the previous embodiments. In some embodiments, the outer optical member 3121 may be sealingly installed in the second observable zone $Z_{32}$.

Figure 4:
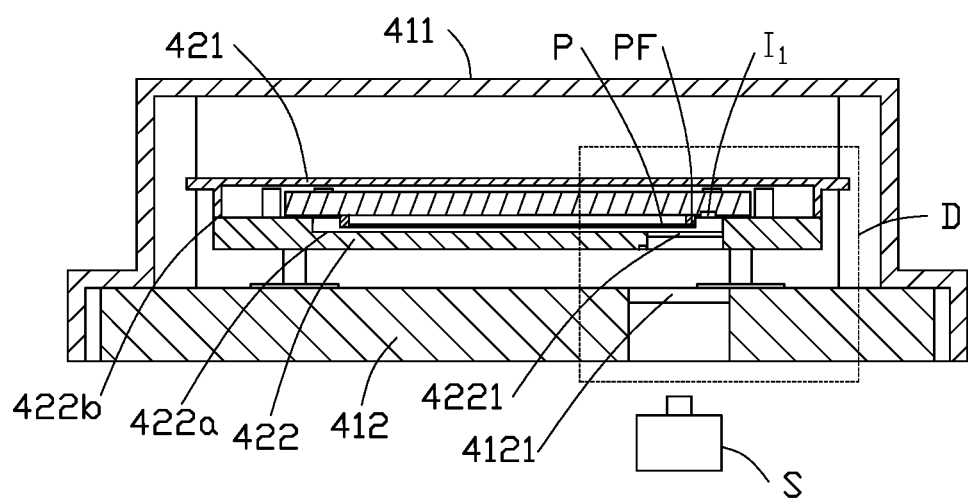
FIG. 4 illustrates a cross-sectional view of a reticle retaining system in accordance with some embodiments of the instant disclosure.
Figure 5:
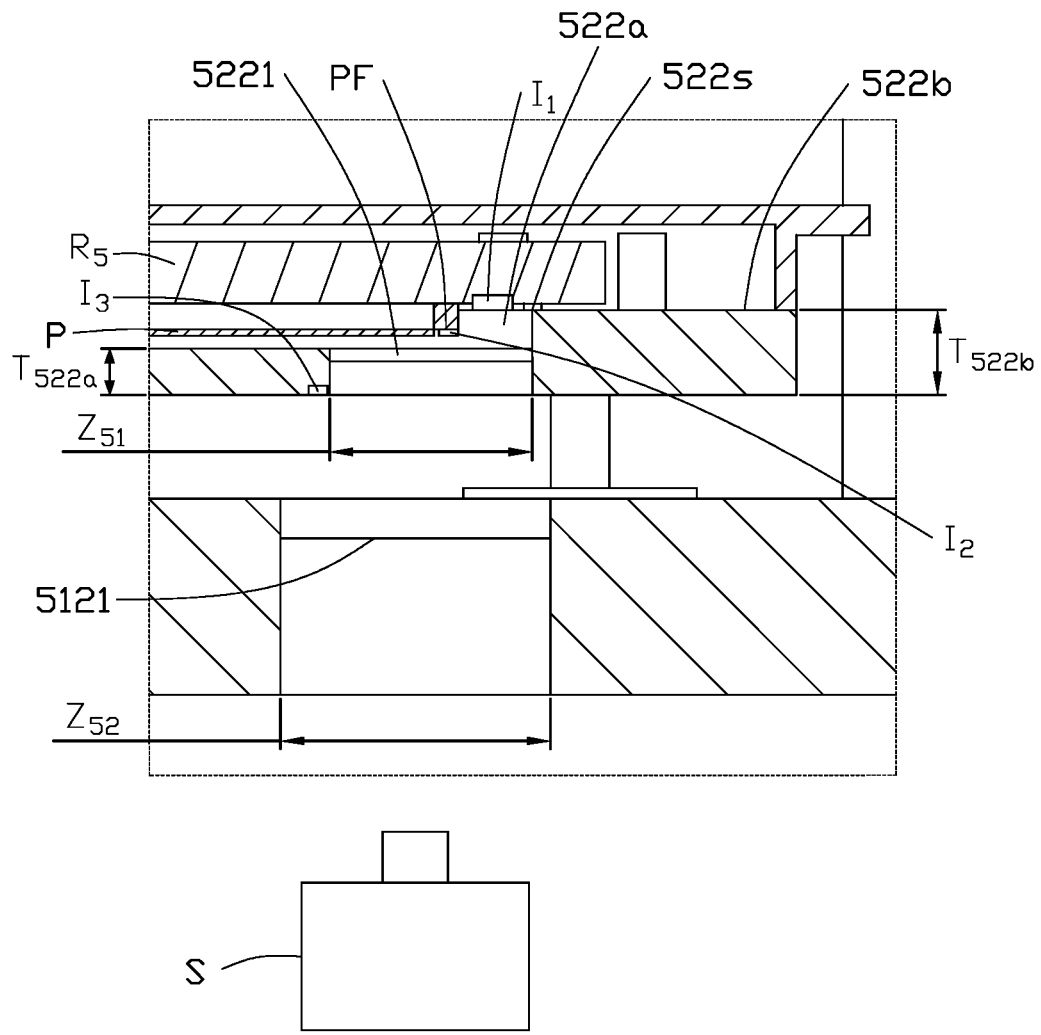
FIG. 5 illustrates a regional cross-sectional view of a reticle retaining system in accordance with some embodiments of the instant disclosure.

FIGS. 4 and 5 respectively illustrate a cross-sectional view and a regional cross-sectional view of a reticle retaining system in accordance with some embodiments of the instant disclosure. For illustrational simplicity and clarity, some detail/sub components of the exemplary device are not explicitly labeled in the instant figure. In some embodiments, the FIG. 5 may be a regional cross-sectional view taken in a doted box D indicated in FIG. 4.

FIG. 4 shows a reticle $R_4$ being received in a reticle accommodating region 422a over an inner base 422. A periphery region 422b of the inner base 422 is shown to be in pressing engagement with an inner cover 421.

In the illustrated embodiment, the reticle $R_4$ includes a first identification feature $I_1$ (e.g., a two-dimensional bar code), a pellicle P arranged proximate the first identification feature $I_1$ and a pellicle frame PF arranged therebetween. A second identification feature $I_2$ (as shown in FIG. 5) is disposed on the pellicle frame PF. A scanner S may be provided to read the first identification feature $I_1$ through an outer optical member 4121. A portion of the pellicle P and the pellicle frame PF may be observed/inspected (e.g., via an interferometer) through the outer optical member 4121 and an inner optical member 4221.

Referring to FIG. 5, in the illustrated embodiment, the arrangement of the first observable zone $Z_{51}$ is correspondingly designed to allow observation of the first identification feature $I_1$ of the reticle $R_5$, the second identification feature $I_2$ of the pellicle frame PF, a portion of the pellicle P, and a portion of the pellicle frame PF upon receiving the reticle $R_5$.

The reticle accommodating region 522a of the inner base 522 includes a step profile 522s in a cross section thereof having a thickness $T_{522a}$ smaller than a thickness $T_{522b}$ of the periphery region 522b. In the illustrated embodiment, a periphery of the reticle $R_5$ is supported above the step profile 522s while the pellicle P and the pellicle PF are arranged projectively surrounded by the step profile 522s. In some embodiments, the step profile 522s may projectively overlap the outer optical member 5121.

In some embodiments, a status of the reticle $R_5$ (e.g., presence of a reticle $R_5$, serial number thereof, the orientation thereof) may be identified with a scanner S through the outer optical member 5121 and the inner optical members (e.g., the viewable member 5221 from current sectional view) without the need to open the reticle retaining system. Also, the third identification feature $I_3$ of the 522 may be scanned to identify the serial number and status of the inner pod.

Figure 6:
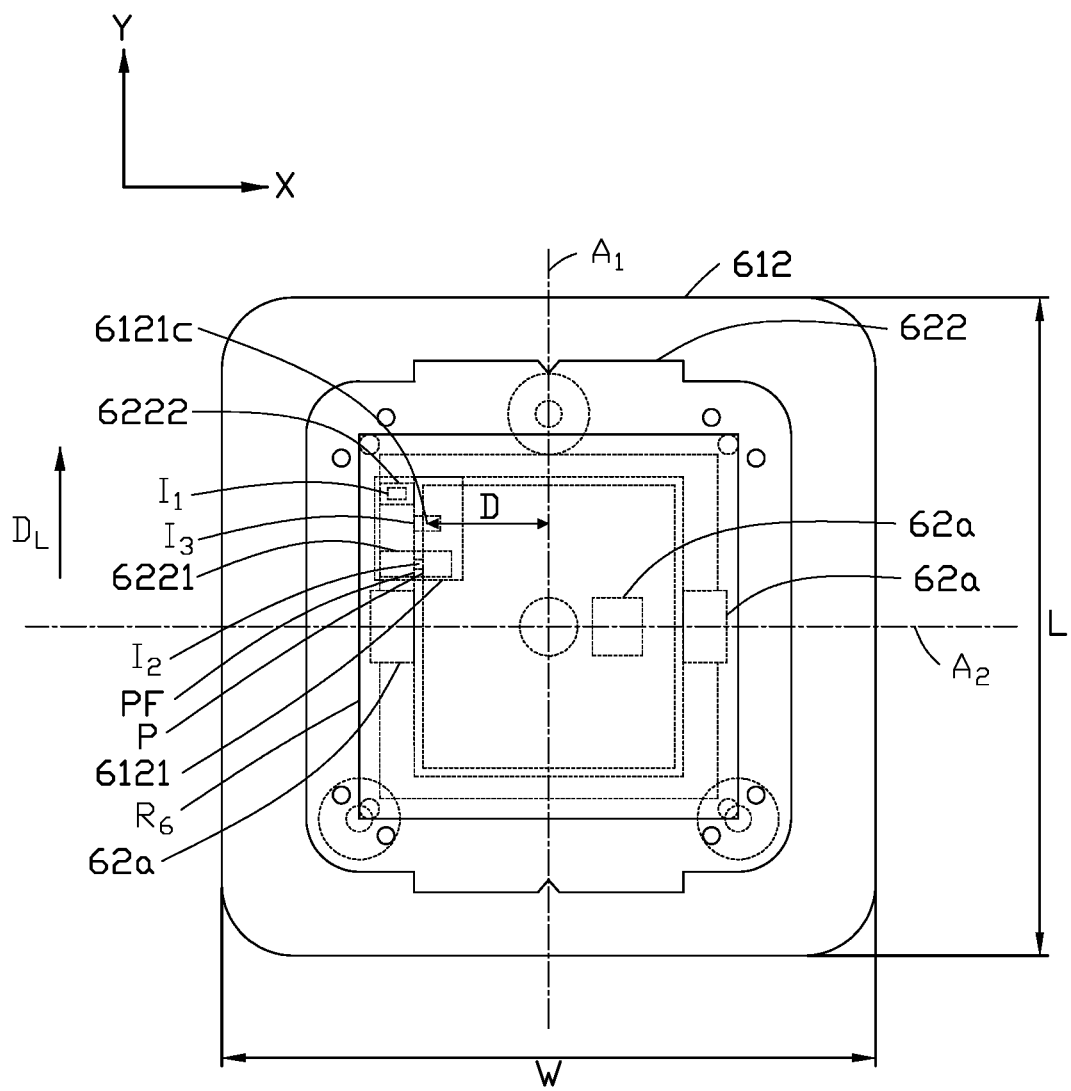
FIG. 6 illustrates a plane view of a reticle retaining system in accordance with some embodiments of the instant disclosure.

FIG. 6 illustrates plane view of a reticle retaining system in accordance with some embodiments of the instant disclosure. For illustrational simplicity and clarity, some detail/sub components of the exemplary device are not explicitly labeled/shown in the instant figure. For example, an inner cover and an outer cover are not shown in FIG. 6.

In the illustrated embodiment, one of the two inner optical members 6221, 6222 is provided with a greater planar area than the other. For example, form the illustrated plane view, inner optical member 6221 has a greater area than inner optical member 6222.

In the illustrated embodiment, the inner optical member 6221 is designed with greater planar area to allow concurrent optical access to the pellicle P, the second identification feature $I_2$ of the pellicle frame PF and a portion of the pellicle frame PF. On the other hand, the inner optical member 6222 is provided with smaller planar area to allow observation of the first identification feature $I_1$. Meanwhile, the outer optical member 6121 is observably aligned with the two inner optical members 6221, 6222, thereby enabling observation of the pellicle P, the second identification feature $I_2$ of the pellicle frame PF and a portion of the pellicle frame PF, and the first identification feature $I_1$ therethrough.

In the illustrated embodiment, the outer optical member 6121 is configured to allow observation of the third identification feature $I_3$. As such, confirmation on information such as the condition of the reticle $R_6$ the pellicle P, the pellicle frame PF, and the identification features $I_1$, $I_2$, $I_3$ may be achieved by observing through the outer optical member 6121, thereby reducing the number of times the outer pod has to be opened.

In some embodiments, the outer optical member may projectively overlap the pair of inner optical members. In the illustrated embodiment, the two inner optical members 6221, 6222 are arranged to be fully overlapped (e.g., projectively covered) by the outer optical member 6121. In such embodiments, the planar area of the outer optical member is equal or greater than that of the two inner optical members. For example, in the illustrated plane view, the planar area of the outer optical member 6121 is greater than that of the two inner optical members 6221, 6222. In some embodiments, some portions of the two inner optical members may not overlap the outer optical member. In such embodiments, the planar area of the outer optical member may be smaller than that of the two inner optical members.

In the illustrated embodiments, the inner optical members 6221, 6222 are arranged near the third identification feature $I_3$. Such arrangement reduces the planar area of the overlapping outer optical member 6121, thus enhancing a structural strength of the outer base 612. In some embodiments, the inner optical members and the third identification feature may be arranged apart from each other. In such embodiments, the outer base 612 may has additional outer optical members (not shown) corresponding in position to the third identification feature $I_3$ and the inner optical members 6221, 6222, respectively.

In some embodiments, the entire bottom face of the outer base may be designed to act as the second observation zone. For example, an outer optical member may occupy the entire bottom of the outer base.

In the illustrated plane view, the outer optical member 6121 has a substantially rectangular planar profile. The third identification feature $I_3$ is arranged between the two inner optical members 6221, 6222 along a length direction $D_L$ of the rectangular profile of the outer optical member 6121. In some embodiments, the inner optical members 6221, 6222 and the planar profile of the outer optical member 6121 may include one or more rounded portion.

The placement location, material, and planar profile of the optical members (e.g., optical member 6121) may take various factors into consideration, such as weight distribution, structural integrity, and overall weight limit of the device components. As shown in the instant embodiment, the outer optical member 6121 is arranged toward a geometric center of the outer base 622. For instance, a geometric center of the outer optical member 6121 is generally arranged within half the distance from the center of the outer base 622 to the outer fringe thereof in both the x and y direction. Such a layout arrangement may help to retain better overall balance of the outer base 622 while maintaining structural integrity thereof. Moreover, such placement arrangement may help to reserve the periphery region of the base member (e.g., outer base 622) for other functional components, such as sealing and latching mechanisms.

In the illustrated embodiment, a distance D from a geometric center 6121c of the outer optical member 6121 to an axis of symmetry $A_1$ of the outer base 612 is shorter than 30% of a length L of the rectangular profile of the outer base 612. In some embodiments, the distance D may be shorter than 30% of a width W of the rectangular profile of the outer base 612. In some embodiments, the distance D may be around 76 mm; the length L may be around 270 mm; the width W may be around 260 mm.

In some embodiments, a distance from the geometric center 6121c to an axis of symmetry $A_2$ of the outer base 612 is shorter than 30% of the length L and/or the width W of the rectangular profile of the outer base 612.

Moreover, the placement arrangement of the optical members (e.g., optical member 6121) may help to reserve the central region of the base member (e.g., outer base 622) for other functional components, such as supporting mechanisms. As shown in the instant embodiment, the outer optical member 6121 projectively offsets the geometric center of the outer base 622.

In the illustrated embodiment, the distance D from the geometric center 6121c of the outer optical member 6121 to the axis of symmetry $A_1$ of the outer base 612 is longer than 10% of a length L and/or the width W of the rectangular profile of the outer base 612. In some embodiments, a distance from the geometric center 6121c to the axis of symmetry $A_2$ is longer than 10% of the length L and/or the width W. In some embodiments, the geometric center 6121c may be arranged at the central region of the outer base 612.

In the illustrated embodiment, the inner base 622 further comprises additional inner optical members (e.g., optical ports 62a) arranged outside the first observable zone $Z_{31}$. Likewise, the outer base may further be provided with additional outer optical members arranged in correspondence to the additional optical ports 62a of the inner pod. For example, additional outer optical members may be correspondingly arranged in observable alignment with the additional inner optical members 62a. In some embodiments, the number of outer optical members (e.g., optical ports 6121) is less than the number of inner optical members (e.g., ports 6121, 6122, 62a).

Accordingly, one aspect of the instant disclosure provides a reticle retainer comprises an inner pod and an outer pod. The inner pod is configured to receive a reticle that includes a first identification feature. The inner pod comprises an inner base having a reticle accommodating region generally at a geometric center thereof and surrounded by a periphery region, and an inner cover configured to establish engagement with the periphery region of the inner base, thereby defining an interior for accommodating the reticle. The inner base has a first observable zone defined in the reticle accommodating region correspondingly arranged to allow observation of the first identification feature. The outer pod is configured to receive the inner base. The outer pod comprises an outer base having a second observable zone defined thereon observably aligned to the first observable zone of the inner pod upon receiving the inner pod and an outer cover configured to engage the outer base and cover the inner pod.

In some embodiments of the present disclosure, the inner pod is further configured to receive a reticle having a pellicle arranged proximate the first identification feature. The first observable zone of the inner base is correspondingly arranged to allow observation of the first identification feature and a portion of the pellicle.

In some embodiments of the present disclosure, the inner base comprises two inner optical members sealingly embedded in the first observable zone to allow observation of the first identification feature and the portion of the pellicle, respectively. The outer base comprises an outer optical member embedded in the second observation zone and observably aligned to the two inner optical members.

In some embodiments of the present disclosure, one of the two inner optical members is provided with a greater planar area than the other.

In some embodiments of the present disclosure, the inner pod is further configured to receive a reticle having a pellicle proximate the first identification feature with a pellicle frame arranged therebetween. The inner optical member with greater planar area is configured to allow observation of a portion of the pellicle frame.

In some embodiments of the present disclosure, a second identification feature is disposed on the pellicle frame. The inner optical member with greater planar area is arranged to allow observation of the second identification feature.

In some embodiments of the present disclosure, the inner base comprises a third identification feature. The outer optical member is arranged to enable observation of the third identification feature.

In some embodiments of the present disclosure, the outer optical member has a rectangular planar profile. The third identification feature is arranged between the two inner optical members along a length direction of the rectangular profile of the outer optical member.

In some embodiments of the present disclosure, the outer optical member projectively overlaps the two inner optical members.

In some embodiments of the present disclosure, a planar area of the outer optical member is greater than that of the two inner optical members.

In some embodiments of the present disclosure, the inner base further comprises additional inner optical members arranged outside the first observable zone. The outer base further comprises additional outer optical members arranged outside the second observable zone. The outer optical members are less than the inner optical members.

In some embodiments of the present disclosure, the reticle accommodating region of the inner base includes a step profile in a cross section thereof having a thickness smaller than that of the periphery region.

In some embodiments of the present disclosure, the inner base comprises electromagnetic interference (EMI) shielding property.

In some embodiments of the present disclosure, the outer base has a substantially planar rectangular profile. The outer optical member has a substantially planar rectangular profile. A distance from a geometric center of the outer optical member to an axis of symmetry of the outer base is shorter than 30% of a length of the rectangular profile of the outer base.

In some embodiments of the present disclosure, the inner optical members has a lower reflectance value than the outer optical member with respect to wavelength in a range between 600 nm to 950 nm.

In some embodiments of the present disclosure, a reflectance value of the outer optical member is less than 15%. A reflectance value of the inner optical members is less than 0.5%.

In some embodiments of the present disclosure, a transmittance value of the outer optical member is greater than 80%.

Accordingly, another aspect of the instant disclosure provides a reticle retainer comprises an inner pod and an outer pod. The inner pod configured to receive a reticle that includes a first identification feature arranged proximate a pellicle. The inner pod comprises an inner base that defines a reticle accommodating region generally at a geometric center thereof and surrounded by a periphery region (322b), and an inner cover configured to establish sealing engagement with the periphery region of the inner base, thereby defining an interior for accommodating the reticle. The inner base includes two inner optical members sealingly arranged in the reticle accommodating region to allow concurrent observation of the first identification feature and a portion of the pellicle of the reticle. The outer pod is configured to receive the inner base. The outer pod comprises an outer base that includes an outer optical member observably aligned to the two inner optical members of the inner pod upon reviving the inner pod, and an outer cover configured to engage and cover the inner pod.

In some embodiments of the present disclosure, the inner pod is further configured to receive a reticle that includes the first identification feature arranged proximate a pellicle and a pellicle frame arranged therebetween. One of the inner optical members is provided with a greater planar area than the other and is arranged to allow observation of a portion of the pellicle and a portion of the pellicle frame.

In some embodiments of the present disclosure, a second identification feature is disposed on the pellicle frame. The inner optical member with greater planar area is arranged to allow observation of the second identification feature.

In some embodiments of the present disclosure, the inner base further comprises a third identification feature. The outer optical member has a planar rectangular profile and is arranged to enable observation of the third identification feature. The third identification feature is arranged between the two inner optical members along a length direction of the rectangular profile of the outer optical member.

The embodiments shown and described above are only examples. Therefore, many such details are neither shown nor described. Even though numerous characteristics and advantages of the present technology have been set forth in the foregoing description, together with details of the structure and function, the disclosure is illustrative only, and changes may be made in the detail, especially in matters of shape, size, and arrangement of the parts within the principles, up to and including the full extent established by the broad general meaning of the terms used in the claims. It will therefore be appreciated that the embodiments described above may be modified within the scope of the claims.

What is claimed is:

1. A reticle retaining system, comprising:
an inner pod configured to receive a reticle having a first identification feature, the inner pod includes an inner base having a reticle accommodation region and a periphery region encircling the reticle accommodation region wherein the inner base has a first observable zone defined in the reticle accommodation region, and an inner cover configured to engage with the periphery region of the inner base in order to define an interior for accommodating the reticle; and
an outer pod, configured to receive the inner pod, and including an outer base having a second observable zone which is observably aligned with the first observable zone when the outer base receives the inner base and an outer cover configured to engage with the outer base to cover the inner pod;
wherein, the first observable zone is provided with at least one inner optical member which permits observation of the first identification feature, the second observable zone has an outer optical member embedded in the outer base, and a geometric center of the outer optical member is projectively offset from a geometric center of the outer base and offset from the inner optical member, the inner optical member projectively overlaps with the outer optical member, and the outer optical member has a planar profile including one or more rounded portions.

2. The reticle retaining system of claim 1, wherein the first observable zone is provided with two inner optical members that permit observation of the first identification feature and a portion of a pellicle on the reticle respectively when the reticle with the pellicle is received in the inner pod, the second observable zone is provided with the outer optical member such that the geometric center of the outer optical member is projectively offset from the geometric center of the outer base and offset from the two inner optical members, the two inner optical members projectively overlap with the outer optical member.

3. The reticle retaining system of claim 1, wherein the second observable zone is observably aligned with the first observable zone such that the first identification feature of the reticle is confirmable when the reticle is received in the inner pod by optical scanning via the outer optical member and the inner optical member.

4. The reticle retaining system of claim 1, wherein a second identification feature of the reticle is observable when the reticle with a pellicle is received in the inner pod via the inner optical member for observing the pellicle on the reticle, the second observable zone is observably aligned with the first observable zone, the first identification feature and second identification feature are confirmable by optical scanning via the outer optical member and the two inner optical members.

5. The reticle retaining system of claim 2, wherein the second observable zone is observably aligned with the first observable zone such that the first identification feature of the reticle and the portion of the pellicle are confirmable when the reticle with the pellicle is received in the inner pod by optical scanning via the outer optical member and the two inner optical members.

6. The reticle retaining system of claim 4, wherein the inner base has a third identification feature provided at a bottom thereof which is confirmable by optical scanning via the outer optical member.

7. The reticle retaining system of claim 2, wherein the portion of the pellicle and a second identification feature of the reticle are observable when the reticle with the pellicle is received in the inner pod via one of the two inner optical members that has a relatively large surface area, the second observable zone is observably aligned with the first observable zone, the portion of the pellicle and the second identification feature of the reticle are confirmable when the reticle with the pellicle is received in the inner pod by optical scanning via the outer optical member and the one of the inner optical members that has the relatively large surface area.

8. A reticle retaining system, comprising:
an inner pod configured to receive a reticle having a first identification feature, the inner pod includes an inner base having a reticle accommodation region and a periphery region encircling the reticle accommodation region wherein the inner base has a first observable zone defined in the reticle accommodation region, and an inner cover configured to engage with the periphery region of the inner base in order to define an interior for accommodating the reticle; and
an outer pod, configured to receive the inner pod, and including an outer base having a second observable zone which is observably aligned with the first observable zone when the outer base receives the inner base and an outer cover configured to engage with the outer base to cover the inner pod;
wherein, the first observable zone is provided with at least one inner optical member which permits observation of the first identification feature, the second observable zone has an outer optical member embedded in the outer base, and a geometric center of the outer optical member is projectively offset from a geometric center of the outer base and offset from the inner optical member, the inner optical member partially overlaps with a planar surface area of the outer optical member.

9. The reticle retaining system of claim 8, wherein the first observable zone is provided with two inner optical members that permit observation of the first identification feature and a portion of a pellicle on the reticle respectively when the reticle with the pellicle is received in the inner pod, the second observable zone is provided with the outer optical member such that the geometric center of the outer optical member is projectively offset from the geometric center of the outer base and offset from the two inner optical members, the two inner optical members partially overlap the planar surface area of the outer optical member.

10. A reticle retaining system, comprising:
an inner pod configured to receive a reticle having a first identification feature, the inner pod includes an inner base having a reticle accommodation region and a periphery region encircling the reticle accommodation region wherein the inner base has a first observable zone defined in the reticle accommodation region, and an inner cover configured to engage with the periphery region of the inner base in order to define an interior for accommodating the reticle; and
an outer pod, configured to receive the inner pod, and including an outer base having a second observable zone which is observably aligned with the first observable zone when the outer base receives the inner base and an outer cover configured to engage with the outer base to cover the inner pod;
wherein, the first observable zone is provided with at least one inner optical member which permits observation of the first identification feature, the second observable zone has an outer optical member embedded in the outer base, the outer optical member and the inner optical member are projectively offset from a geometric center of the outer base, the inner optical member projectively overlaps with the outer optical member.

11. The reticle retaining system of claim 10, wherein the first observable zone is provided with two inner optical members that permit observation of the first identification feature and a portion of a pellicle on the reticle respectively when the reticle with the pellicle is received in the inner pod, the second observable zone is provided with the outer optical member such that the geometric center of the outer optical member is projectively offset from the geometric center of the outer base and offset from the two inner optical members, the two inner optical members overlap with the outer optical member.

12. A reticle retaining system, comprising:
an inner pod configured to receive a reticle having a first identification feature, the inner pod includes an inner base having a reticle accommodation region and a periphery region encircling the reticle accommodation region wherein the inner base has a first observable zone defined in the reticle accommodation region, and an inner cover configured to engage with the periphery region of the inner base in order to define an interior for accommodating the reticle; and
an outer pod, configured to receive the inner pod, and including an outer base having a second observable zone which is observably aligned with the first observable zone when the outer base receives the inner base and an outer cover configured to engage with the outer base to cover the inner pod;
wherein, the first observable zone is provided with at least one inner optical member which permits observation of the first identification feature, the second observable zone has an outer optical member embedded in the outer base, the inner optical member projectively overlaps with the outer optical member, the outer base has a rectangular profile with a symmetry axis, a distance between a geometric center of the outer optical member and the symmetry axis is shorter than 30% of a length or a width of the rectangular profile.

13. The reticle retaining system of claim 12, wherein the first observable zone is provided with two inner optical members that permit observation of the first identification feature and a portion of a pellicle on the reticle respectively when the reticle with the pellicle is received in the inner pod, the two inner optical members projectively overlap with the outer optical member.

14. A reticle retaining system, comprising:
an inner pod configured to receive a reticle having a first identification feature, the inner pod includes an inner base having a reticle accommodation region and a periphery region encircling the reticle accommodation region wherein the inner base has a first observable zone defined in the reticle accommodation region, and an inner cover configured to engage with the periphery region of the inner base in order to define an interior for accommodating the reticle; and
an outer pod, configured to receive the inner pod, and including an outer base having a second observable zone which is observably aligned with the first observable zone when the outer base receives the inner base and an outer cover configured to engage with the outer base to cover the inner pod;
wherein, the first observable zone is provided with at least one inner optical member which permits observation of the first identification feature, the second observable zone has an outer optical member embedded in the outer base, the inner optical member projectively overlaps with the outer optical member, the outer base has a rectangular profile with a symmetry axis, a distance between a geometric center of the outer optical member and the symmetry axis is longer than 10% of a length or a width of the rectangular profile.

15. The reticle retaining system of claim 14, wherein the first observable zone is provided with two inner optical members that permit observation of the first identification feature and a portion of a pellicle on the reticle respectively when the reticle with the pellicle is received in the inner pod, the two inner optical members projectively overlap with the outer optical member.

16. A reticle retaining system, comprising:
an inner pod configured to receive a reticle having a first identification feature, the inner pod includes an inner base having a reticle accommodation region and a periphery region encircling the reticle accommodation region wherein the inner base has a first observable zone defined in the reticle accommodation region, and an inner cover configured to engage with the periphery region of the inner base in order to define an interior for accommodating the reticle; and
an outer pod, configured to receive the inner pod, and including an outer base having a second observable zone which is observably aligned with the first observable zone when the outer base receives the inner base and an outer cover configured to engage with the outer base to cover the inner pod;
wherein, the first observable zone is provided with at least one inner optical member, the second observable zone has an outer optical member embedded in the outer base, such that the first identification feature of the reticle is confirmable by optical scanning via the outer optical member and the inner optical member.

17. The reticle retaining system of claim 16, wherein the first observable zone is provided with two inner optical members, the second observable zone is provided with the outer optical member through which said optical scanning is applicable to confirm the first identification feature and a portion of a pellicle on the reticle respectively when the reticle with the pellicle is received in the inner pod.

* * * * *